(12) United States Patent
Walls et al.

(10) Patent No.: US 9,672,909 B2
(45) Date of Patent: Jun. 6, 2017

(54) MEMORY CELL RETENTION ENHANCEMENT THROUGH ERASE STATE MODIFICATION

(71) Applicant: Microchip Technology Incorporated, Chandler, AZ (US)

(72) Inventors: Jim Walls, Mesa, AZ (US); Santosh Murali, Tempe, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/554,383

(22) Filed: Nov. 26, 2014

(65) Prior Publication Data
US 2015/0310915 A1   Oct. 29, 2015

Related U.S. Application Data

(60) Provisional application No. 61/985,993, filed on Apr. 29, 2014.

(51) Int. Cl.
*G11C 13/00* (2006.01)
*G11C 7/04* (2006.01)

(52) U.S. Cl.
CPC ............ *G11C 13/0069* (2013.01); *G11C 7/04* (2013.01); *G11C 13/0007* (2013.01);
(Continued)

(58) Field of Classification Search
CPC ............ G11C 13/0069; G11C 13/0097; G11C 13/0007; G11C 13/0011; G11C 13/0035;
(Continued)

(56) References Cited

U.S. PATENT DOCUMENTS

| 8,659,931 B1 * | 2/2014 | Ertosun | G11C 13/0007 365/148 |
| 9,007,808 B1 * | 4/2015 | Dinh | G11C 13/0033 365/148 |

(Continued)

FOREIGN PATENT DOCUMENTS

EP   2400499 A1   12/2011   ............ G11C 13/00

OTHER PUBLICATIONS

Jameson, J.R. et al., "Conductive-Bridge Memory (CBRAM) with Excellent High-Temperature Retention," Electron Devices Meeting (IEDM), Dec. 2013.*

(Continued)

*Primary Examiner* — Marc Armand
*Assistant Examiner* — Younes Boulghassoul
(74) *Attorney, Agent, or Firm* — Slayden Grubert Beard PLLC

(57) ABSTRACT

A method of controlling a resistive memory cell is provided. A resistance threshold value is defined for the memory cell, wherein a circuit identifies the cell as erased if a detected resistance of the cell is above the resistance threshold and identifies the cell as programmed if the detected resistance is below the resistance threshold value. A filament is formed across an electrolyte switching region of the cell by applying an electrical charge, wherein the cell having the formed filament has a first resistance. The cell is then erased to an erased state having a second resistance greater than the first resistance. The cell is then programmed to a quasi-erased state having a third resistance between the first and second resistances, and above the resistance threshold value such that the cell is identified by the circuit as erased. The cell may then be maintained in the quasi-erased state.

17 Claims, 5 Drawing Sheets

(52) U.S. Cl.
CPC ...... *G11C 13/0011* (2013.01); *G11C 13/0097* (2013.01); *G11C 13/0035* (2013.01); *G11C 2013/0083* (2013.01)

(58) Field of Classification Search
CPC ....... G11C 13/0002; G11C 7/04; H01L 45/08; H01L 45/1233; H01L 45/146; H01L 45/085; H01L 45/148; H01L 45/12; H01L 27/2409; H01L 27/101; H01L 27/2463
USPC ............................. 365/148, 163; 257/4, 379
See application file for complete search history.

(56) References Cited

U.S. PATENT DOCUMENTS

| | | | |
|---|---|---|---|
| 9,047,948 B1* | 6/2015 | Dinh | G11C 11/5614 |
| 2012/0305879 A1* | 12/2012 | Lu | H01L 27/101 |
| | | | 257/4 |
| 2014/0192585 A1* | 7/2014 | Hashim | H01L 45/08 |
| | | | 365/148 |

OTHER PUBLICATIONS

International Search Report and Written Opinion, Application No. PCT/US2015/028261, 9 pages, Sep. 4, 2015.
Jameson, J.R. et al., "Conductive-Bridge Memory (CBRAM) with Excellent High-Temperature Retention," Electron Devices Meeting (IEDM), 4 pages, Dec. 2013.

* cited by examiner

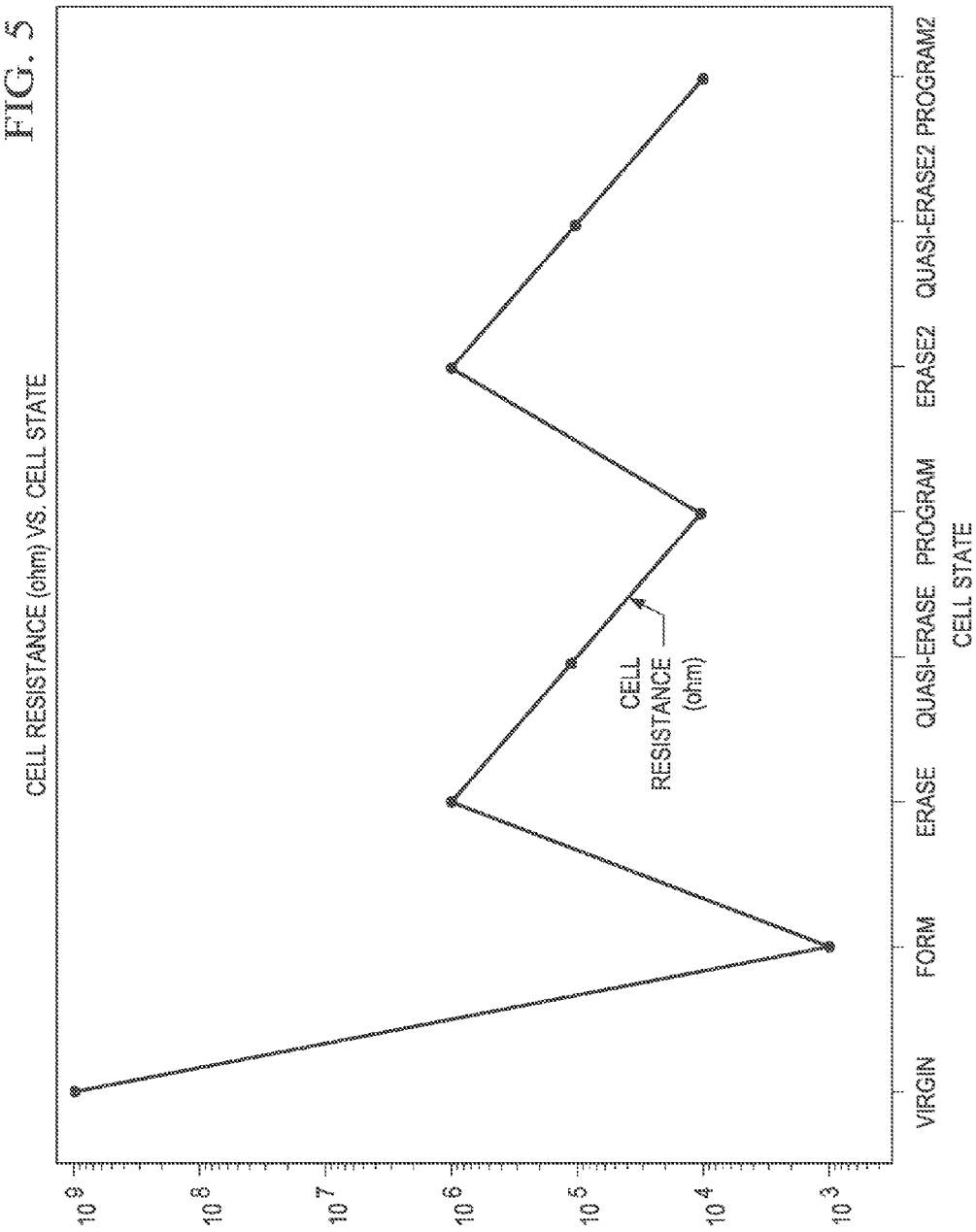

MEMORY CELL RETENTION ENHANCEMENT THROUGH ERASE STATE MODIFICATION

RELATED PATENT APPLICATIONS

This application claims the benefit of U.S. Provisional Application No. 61/985,993 filed on Apr. 29, 2014, which is incorporated herein in its entirety

TECHNICAL FIELD

The present disclosure relates to resistive memory cells, e.g., resistive random-access memory (ReRAM) cells, conductive-bridging RAM (CBRAM) cells, and similar memory cells, and in particular, to systems and methods for providing a consistent, controllable, and enduring erased state in such cells.

BACKGROUND

It has become clear from experimentation that maintaining the high-resistance (erased) state at temperature is often a challenge for CBRAM/ReRAM cells. In contrast, the program state (low resistance) is consistently more stable. Typical gadolinium oxide (GdO) CBRAM memory cells can exhibit good retention (long-term storage for programs) or good endurance (cyclic operation for data manipulation), but often only one or the other, not both. For example, good endurance may be achievable at the expense of high-temperature retention, especially on HRS (erase) side. Typically, an electrical pre-treatment (forming) dictates whether a cell is better for either endurance or retention.

SUMMARY

The present disclosure discusses the inventive concept of, rather than trying to erase the bit to its highest resistance state, programming the bit to a higher "quasi erased" level (from the erased state), which provides superior high-temperature (erased-state) data retention characteristics, as compared with the typical technique of erasing the bit to its highest resistance state. In some implementations this may affect erase margin and/or operating window, but the advantage will be a more stable pair of states over both time (endurance) and temperature. Embodiments of the invention include a new or modified programming/erase algorithm, and memory architecture to facilitate an "erase-before-shallow-program" methodology for the "quasi erased" operation.

The invention is based in part on the unexpected recent findings that the endurance and retention of a bit's resistance state are independent of how the specific bit resistance was arrived at (either by programming or erasing). This was revealed, for example, in an IEDM paper "Conductive-bridge memory (CBRAM) with excellent high-temperature retention," J. R. Jameson, et al, IEDM, published in December 2013.

Some embodiments provide a method of controlling a resistive memory cell. A resistance threshold value is defined for the memory cell, wherein the memory cell is identified by a circuit as erased if a detected resistance of the cell is above the resistance threshold value and identified by the circuit as programmed if the detected resistance of the cell is below the resistance threshold value. A filament is formed across an electrolyte switching region of the resistive memory cell by applying an electrical charge, wherein the memory cell having the formed filament has a first resistance. The memory cell is then erased to an erased state having a second resistance greater than the first resistance. The memory cell is then programmed to a quasi-erased state having a third resistance between the first and second resistances, and above the resistance threshold value such that the memory cell is identified by the circuit as erased. The cell may then be maintained in the quasi-erased state.

The resistive memory cell may be a conductive-bridging RAM (CBRAM) cell or a resistive random-access memory (ReRAM) cell, for example.

In a further embodiment, the method may also include programming the memory cell to a programmed state having a fourth resistance below the resistance threshold value such that the memory cell is identified by the circuit as programmed. In some embodiments, the third resistance corresponding to the quasi-erased state is at least 3 times, at least 5 times, or at least 10 times, the fourth resistance corresponding to the programmed state. In some embodiments, the third resistance corresponding to the quasi-erased state is between 50 kΩ and 200 kΩ, for example, about 100 kΩ.

Other embodiments provide a system for managing a resistive memory cell, including (a) a circuit configured to determine the status of the resistive memory cell, (b) electronics storing a resistance threshold value for the memory cell, wherein the memory cell is identified by the circuit as erased if a detected resistance of the cell is above the resistance threshold value and identified by the circuit as programmed if the detected resistance of the cell is below the resistance threshold value, and (c) control electronics configured to (i) form a filament across an electrolyte switching region of the resistive memory cell by applying an electrical charge, wherein the memory cell having the formed filament has a first resistance, (ii) erase the memory cell to an erased state having a second resistance greater than the first resistance, and (iii) program the memory cell to a quasi-erased state having a third resistance between the first and second resistances, and above the resistance threshold value such that the memory cell is identified by the circuit as erased. The cell may then be maintained in the quasi-erased state.

BRIEF DESCRIPTION OF THE FIGURES

Example embodiments are discussed below with reference to the drawings, in which:

FIG. 5 illustrates an example process flow showing the respective resistances for various states of the disclosed memory cell, according to an example embodiment.

DETAILED DESCRIPTION

Figure 1:
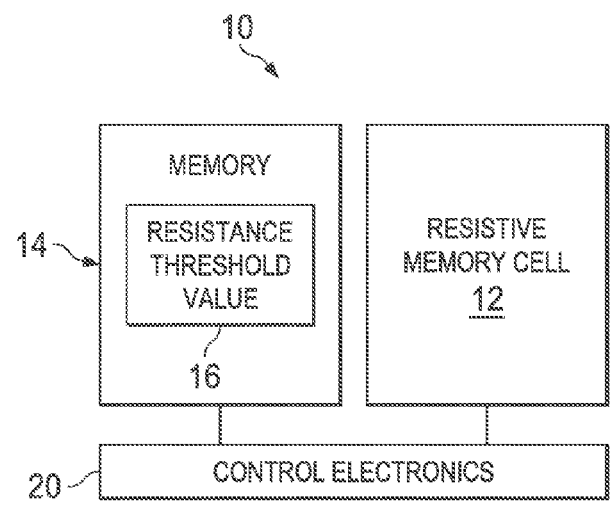
FIG. 1 shows an example circuit including a resistive memory cell 12 (e.g., a CBRAM or ReRAM cell), according to one embodiment.

FIG. 1 shows an example circuit 10 including a resistive memory cell 12 (e.g., a CBRAM or ReRAM cell) that may be formed and programmed as disclosed herein, according to one embodiment. Circuit 10 includes a memory 14 storing a resistance threshold value 16 for the memory cell 12, and control electronics 20 configured to (a) determine the status of the resistive memory cell 12 (e.g., programmed or erased) by detecting the resistance of the cell and comparing to the stored resistance threshold value 16, and (b) control the status (e.g., program and erase) of the memory cell 12. Various functions of circuit 10 are discussed below.

Figure 2A:
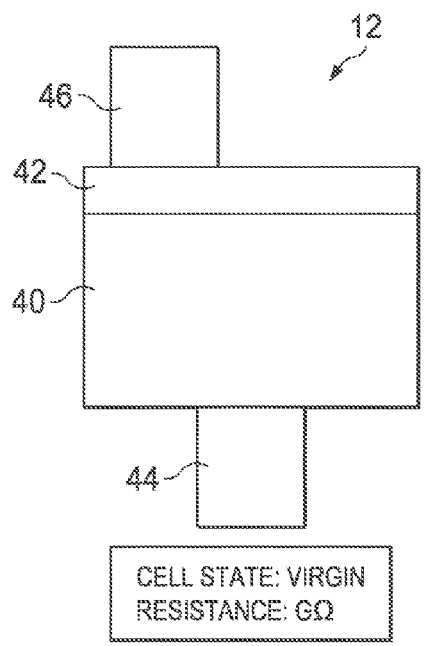
FIGS. 2A-2F show an example method for forming and programming a resistive memory cell (e.g., CBRAM or ReRAM cell), according to one embodiment.

FIGS. 2A-2F show an example method for forming and programming a resistive memory cell 12 (e.g., CBRAM or ReRAM cell), according to one embodiment. As shown in FIG. 2A, a "virgin" resistive memory cell 12 is provided, i.e., a memory cell in which a conductive filament not yet been formed. For example, a virgin memory cell 12 may be a newly manufactured cell. The virgin memory cell 12 typically has a very high resistance, e.g., in the giga-ohm (GΩ) range, e.g., 1 GΩ-100 GΩ as shown in FIG. 2A. The memory cell 12 may include a top (active) electrode 42 and a bottom (passive) electrode 44 separated by a solid electrolyte switching region 40. A top contact 46 may be conductively coupled to the top electrode 42.

Figure 2B:
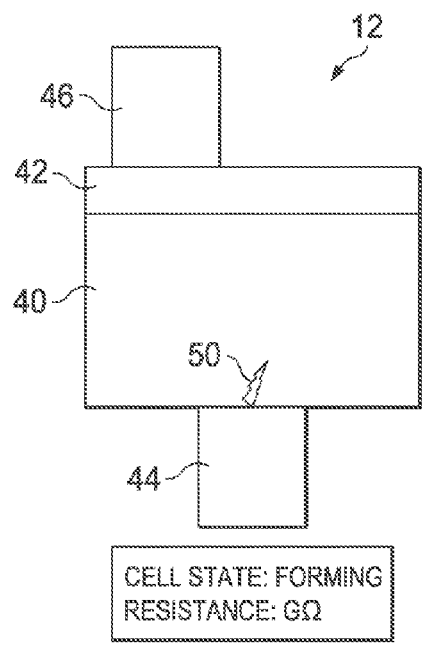
Figure 2C:
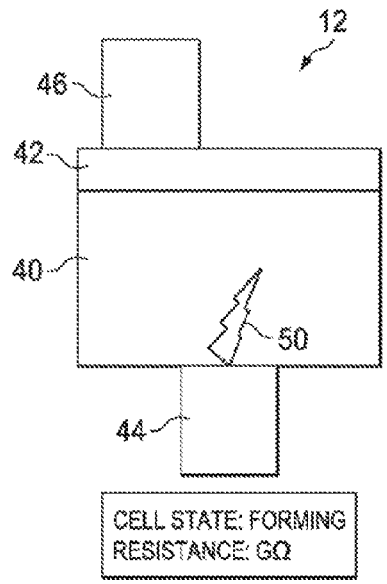
Figure 2D:
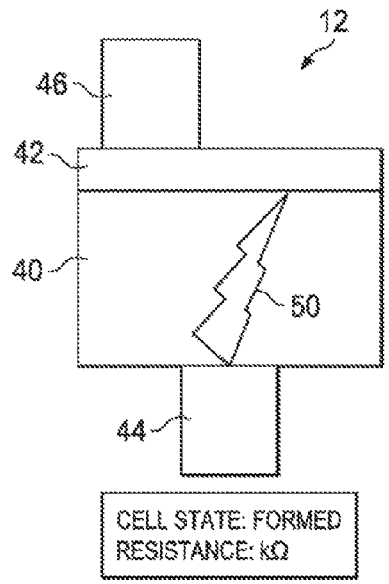

The cell may then be "formed" by forming a conductive filament 50 across the electrolyte switching region 20 by applying an electrical charge, or "stress," to the cell 12, as indicated by the progression shown in FIGS. 2B-2D. The memory cell with the fully formed conductive filament 50 as shown in FIG. 2D has a low resistance, e.g., in the kilo-ohm (kΩ) range, e.g., 10 kΩ-20 kΩ.

Figure 2E:
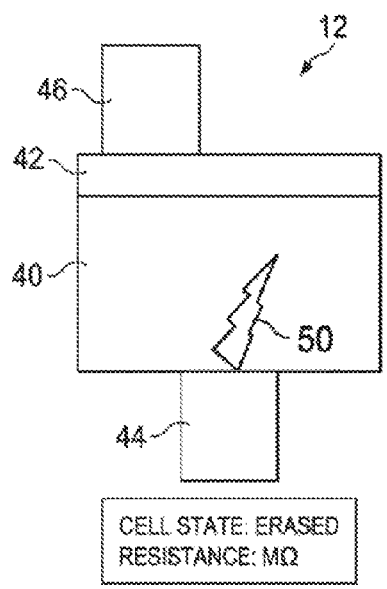

Cell 12 may then be erased to an "erased" state by applying appropriate electrical charges, which shrinks the conductive filament 50, thereby increasing the resistance of the cell 12, as shown in FIG. 2E. For example, the erased cell 12 may have a resistance in the mega-ohm (MΩ) range, e.g., 0.5 MΩ-100 MΩ, as shown in FIG. 2E, which is substantially less than the resistance of the virgin memory cell.

Figure 2F:
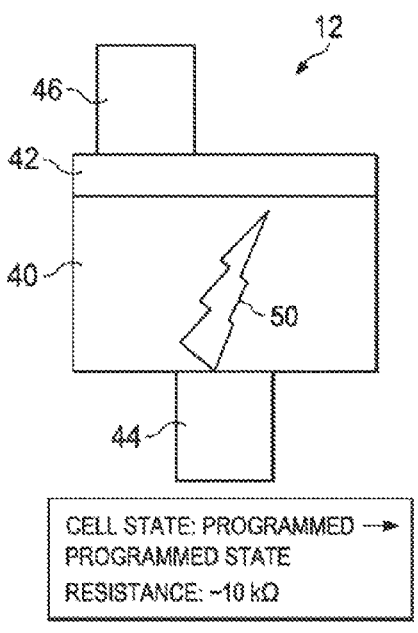

A control circuit (e.g., control electronics 20 shown in FIG. 1) may then program cell 12 to either (a) to a typical "programmed" state, as shown in FIG. 2F(a), or (b) to a "quasi-erased" state, as shown in FIG. 2F(b). The control circuit 20 may store a preset resistance threshold value 16 for the memory cell, and may detect the resistance of the cell 10 and identify the cell as "erased" (0 value) if the detected resistance is above the resistance threshold value and identify the cell as "programmed" (1 value) if the detected resistance is below the resistance threshold value. Thus, the control circuit 20 may selectively place the cell (a) in a programmed state by programming cell 10 to a predefined "programmed state" resistance below the resistance threshold value (by applying appropriate charges that grow the conductive filament 50 to define the predefined "programmed state" resistance) or (b) in a quasi-erased state by programming cell 10 to a predefined "quasi-erased state" resistance above the resistance threshold value (by applying appropriate charges that grow the conductive filament 50 to define the predefined "quasi-erased state" resistance).

FIG. 2F(a) shows the memory cell 12 programmed to the programmed state, in which cell 12 is programmed to a predefined "programmed state" resistance below the resistance threshold value 16. In the illustrated example, the "programmed state" resistance is about 10 kΩ. FIG. 2F(b) shows the cell 12 programmed to the quasi-erased state, in which cell 12 is erased to a predefined "quasi-erased state" resistance above the resistance threshold value. In the illustrated example, the "quasi-erased state" resistance is about 100 kΩ.

The resistance threshold value 16, the predefined "programmed state" resistance, and the predefined "quasi-erased state" resistance may have any suitable values, which may be static or modified over time, either automatically or by user input via any suitable user interface. In some embodiments, the predefined "quasi-erased state" resistance is at least 3 times the predefined "programmed state" resistance. In some embodiments, the predefined "quasi-erased state" resistance is at least 5 times the predefined "programmed state" resistance. In particular embodiments, the predefined "quasi-erased state" resistance is at least 10 times the predefined "programmed state" resistance.

In some example embodiments, the predefined "quasi-erased state" resistance is between 50 kΩ and 200 kΩ, e.g., 100 kΩ or about 100 kΩ, while the predefined "programmed state" resistance is between 1 kΩ and 20 kΩ, e.g., 10 kΩ or about 10 kΩ. In such example embodiments, the resistance threshold value may be any value between the predefined "quasi-erased state" resistance and the predefined "programmed state" resistance, e.g., between 10 kΩ and 100 kΩ, or between 30 kΩ and 80 kΩ. As one example only, the resistance threshold value may be 50 kΩ or about 50 kΩ, the "quasi-erased state" resistance may be 100 kΩ or about 100 kΩ, and the "programmed state" resistance may be 10 kΩ or about 10 kΩ. The resistance threshold value may be centered between the "quasi-erased state" resistance and the "programmed state" resistance, or may be biased toward one of the two values. As used herein, the qualifier "about" means plus or minus 10%.

The control circuit 20 may selectively switch the state of the memory cell 12 between the programmed state and quasi-erased state, based on various desired operations of a circuit incorporating cell 12. In some embodiments, each instance of placing cell 12 into the quasi-erased state involves a two-step process of erasing the cell (e.g., as shown in FIG. 2E) and then programming the cell into the quasi-erased state (e.g., as shown in FIG. 2F(b)).

Figure 3:
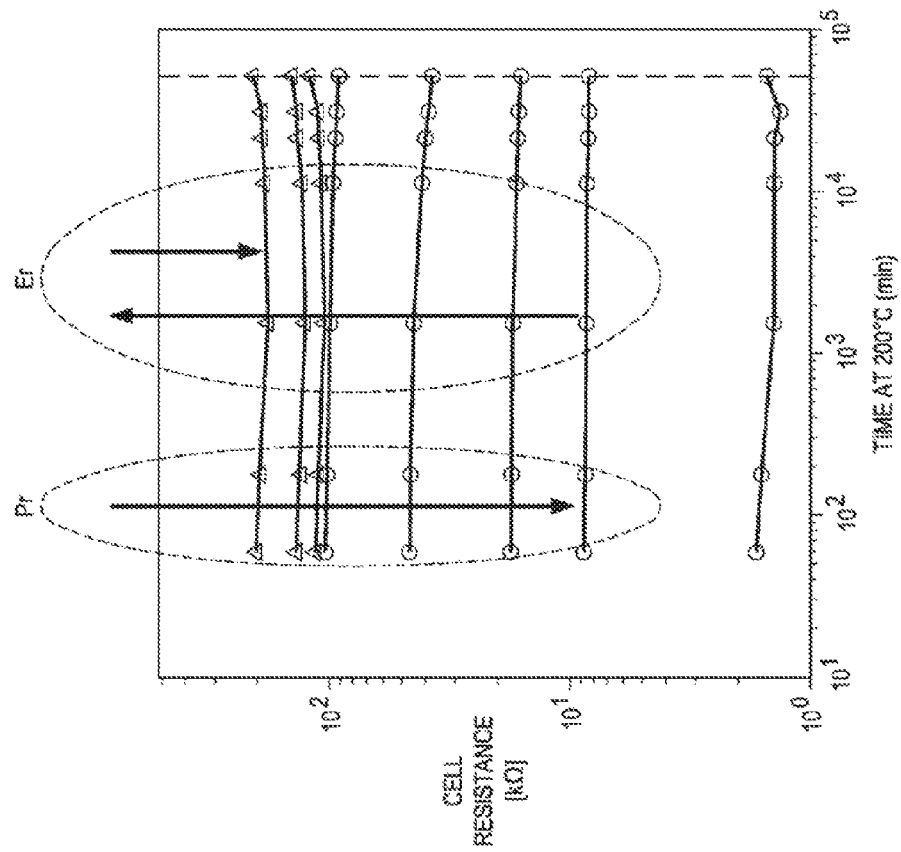
FIG. 3 shows the change in cell resistance for a conventional programming process followed by a two-step erase process according to an embodiment of the invention.
Figure 2F:
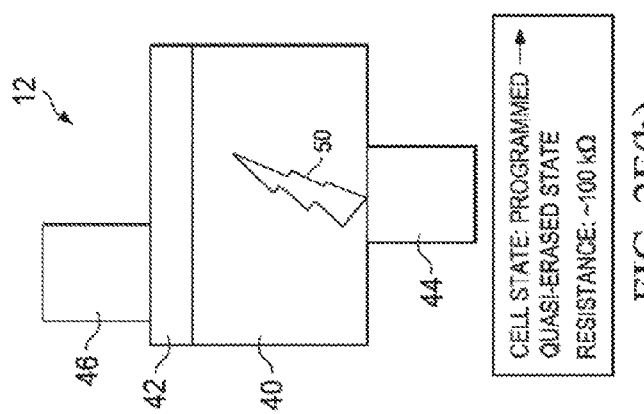

FIG. 3 shows the change in cell resistance for a typical programming process (left oval labelled "Pr") followed by a two-step erase process (right oval labelled "Er"). As discussed above, the two-step erase process may involve erasing the cell to increase the cell resistance, e.g., the MΩ range, and then programming the cell into the quasi-erased state to a relatively high resistance (as compared to the programmed state), e.g., the 100 kΩ range.

FIG. 3 also shows test data for long-term retention at 200° C. for various resistance values obtained via the disclosed programming operations, including data showing long-term effects after an erase operation (indicated by triangles) and data showing long-term effects after a write operation (indicated by circles). As shown, the resistance of the cell is substantially stable over very long periods at 200° C. for all resistance values within the "programmed" range, regardless of whether the resistance is reached by writing or erasing.

Figure 4:
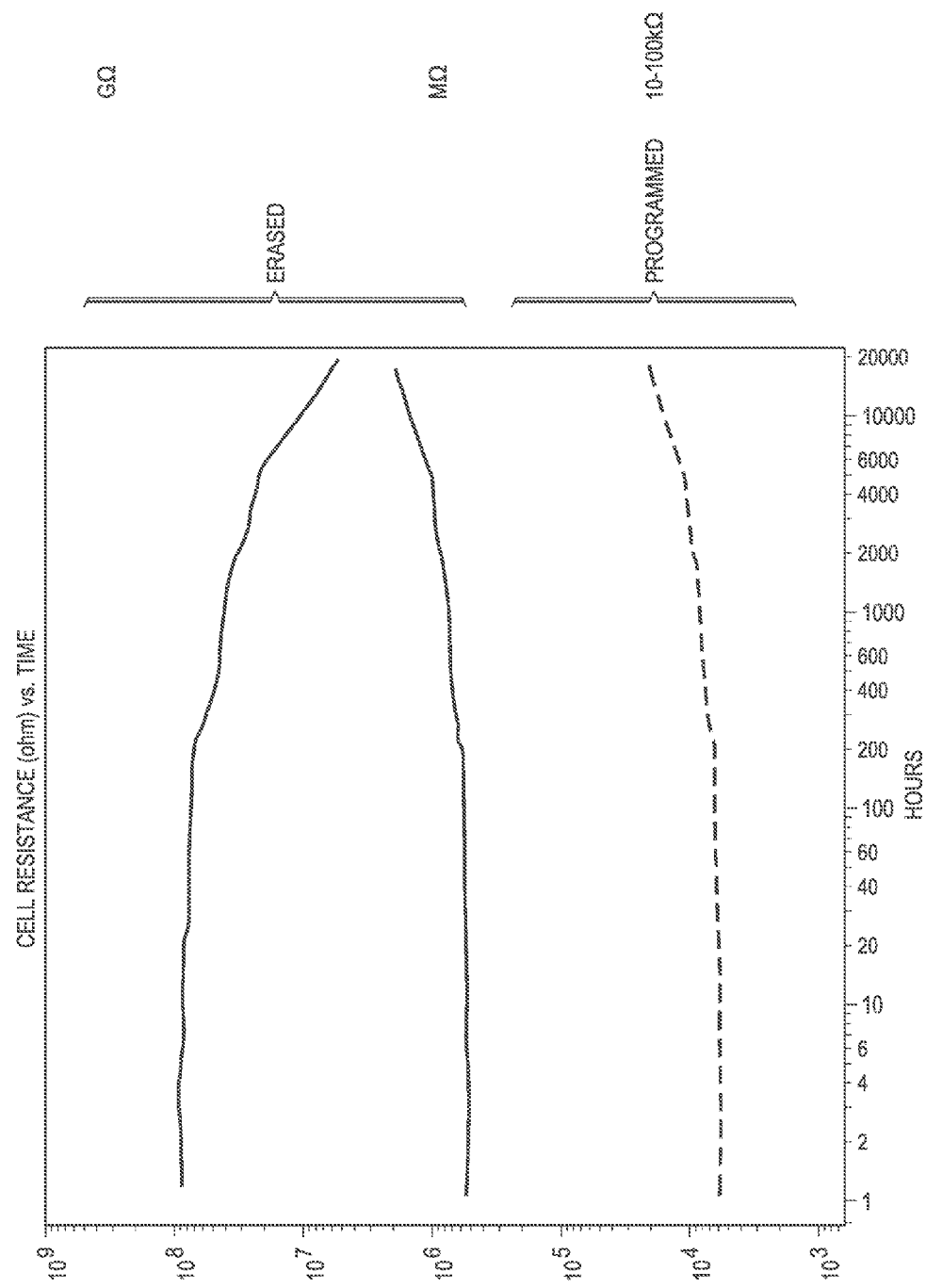
FIG. 4 indicates an illustrative chart showing time-dependent behavior of a resistive memory cell, e.g., at elevated temperature, according to one embodiment.

FIG. 4 indicates an illustrative chart showing time-dependent behavior of a resistive memory cell, e.g., at elevated temperature. As shown, the resistance of a cell maintained at a high-resistance erase state degrades rapidly after some time, which may lead to automatic (and unwanted) filament formation across the cell electrolyte. In contrast, lower resistance cell operation is much more stable over time, and may actually increase gradually over time.

What is claimed is:

1. A method of controlling a resistive memory cell having binary values of 0 and 1, comprising:
 defining a resistance threshold value for the memory cell,
  wherein the memory cell is identified by a circuit as erased having a 0 value if a detected resistance of the memory cell is above the resistance threshold value and identified by the circuit as programmed having a 1 value if the detected resistance of the memory cell is below the resistance threshold value;

providing the memory cell in a virgin state with no filament formed therein, the virgin state of the memory cell defining a maximum resistance value of the memory cell;

forming a filament across an electrolyte switching region of the resistive memory cell by applying an electrical charge, wherein the memory cell having the formed filament has a first resistance below the resistance threshold value;

erasing the memory cell by partially shrinking the filament to define an erased state having a 0 value and having a second resistance greater than the first resistance and above the resistance threshold value, but substantially less than the maximum resistance value of the memory cell;

programming the memory cell to a quasi-erased state having a 0 value and having a third resistance between the first and second resistances, and above the resistance threshold value such that the memory cell is identified by the circuit as erased;

maintaining the memory cell in the quasi-erased state until a reprogramming of the memory cell; and programming the memory cell to a programmed state having a 1 value and having a fourth resistance between the first and third resistances, and below the resistance threshold value such that the memory cell is identified by the circuit as programmed.

2. The method of claim 1, wherein the resistive memory cell comprises a conductive-bridging RAM (CBRAM) cell.

3. The method of claim 1, wherein the resistive memory cell comprises a resistive random-access memory (ReRAM) cell.

4. The method of claim 1, wherein the third resistance corresponding to the quasi-erased state is at least 3 times the fourth resistance corresponding to the programmed state.

5. The method of claim 1, wherein the third resistance corresponding to the quasi-erased state is at least 5 times the fourth resistance corresponding to the programmed state.

6. The method of claim 1, wherein the third resistance corresponding to the quasi-erased state is at least 10 times the fourth resistance corresponding to the programmed state.

7. The method of claim 1, wherein the third resistance corresponding to the quasi-erased state is between 50 k$\Omega$ and 200 k$\Omega$.

8. The method of claim 1, wherein the third resistance corresponding to the quasi-erased state is about 100 k$\Omega$.

9. The method of claim 1, wherein the second resistance associated with the erased state of the memory is more than an order of magnitude less than the maximum resistance value of the memory cell.

10. A system for managing a resistive memory cell having binary values of 0 and 1, comprising:

a circuit configured to determine the status of the resistive memory cell;

electronics storing a resistance threshold value for the memory cell, wherein the memory cell is identified by the circuit as erased having a 0 value if a detected resistance of the memory cell is above the resistance threshold value and identified by the circuit as programmed having a 1 value if the detected resistance of the memory cell is below the resistance threshold value; and control electronics configured to:

form the resistive memory cell from a virgin state of the resistive memory cell having no filament formed therein and having a maximum resistance value of the memory cell, wherein forming the resistive memory cell comprises forming a filament across an electrolyte switching region of the resistive memory cell by applying an electrical charge, wherein the memory cell having the formed filament has a first resistance below the resistance threshold value;

erase the memory cell by partially shrinking the filament to define an erased state having a 0 value and having a second resistance greater than the first resistance and above the resistance threshold value, but substantially less than the maximum resistance value of the memory cell;

program the memory cell to a quasi-erased state having a 0 value and having a third resistance between the first and second resistances, and above the resistance threshold value such that the memory cell is identified by the circuit as erased;

maintain the memory cell in the quasi-erased state until a reprogramming of the memory cell; and program the memory cell to a programmed state having a 1 value and having a fourth resistance between the first and third resistances, and below the resistance threshold value such that the memory cell is identified by the circuit as programmed.

11. The system of claim 10, wherein the resistive memory cell comprises a conductive-bridging RAM (CBRAM) cell.

12. The system of claim 10, wherein the resistive memory cell comprises a resistive random-access memory (ReRAM) cell.

13. The system of claim 10, wherein the third resistance corresponding to the quasi-erased state is at least 3 times the fourth resistance corresponding to the programmed state.

14. The system of claim 10, wherein the third resistance corresponding to the quasi-erased state is at least 5 times the fourth resistance corresponding to the programmed state.

15. The system of claim 10, wherein the third resistance corresponding to the quasi-erased state is at least 10 times the fourth resistance corresponding to the programmed state.

16. The system of claim 10, wherein the third resistance corresponding to the quasi-erased state is between 50 k$\Omega$ and 200 k$\Omega$.

17. The system of claim 10, wherein the third resistance corresponding to the quasi-erased state is about 100 k$\Omega$.

* * * * *